United States Patent [19]

Capizzi, Jr.

[11] Patent Number: 4,687,952

[45] Date of Patent: Aug. 18, 1987

[54] DYNAMIC ANGULAR POSITION SENSOR FOR A REFERENCE GEAR TOOTH

[75] Inventor: Anthony Capizzi, Jr., Columbia, Conn.

[73] Assignee: United Technologies Corporation, Hartford, Conn.

[21] Appl. No.: 577,474

[22] Filed: Feb. 6, 1984

[51] Int. Cl.[4] .......... H03K 5/00; H03K 5/26; G01B 7/14; G08B 21/00

[52] U.S. Cl. .......... 307/261; 307/515; 324/208; 340/679

[58] Field of Search .......... 307/515, 516, 358, 261; 328/5; 377/27; 324/207, 208, 173, 4, 5; 340/686, 684, 679; 73/462; 33/1 PT, 1 N

[56] References Cited

U.S. PATENT DOCUMENTS

| | | | |
|---|---|---|---|
| 3,727,202 | 1/1972 | Fort | 307/265 |
| 3,930,201 | 9/1974 | Ackermann et al. | 324/208 |
| 4,060,707 | 3/1976 | Olsson et al. | 73/462 |
| 4,072,893 | 6/1976 | Huwyler | 324/208 |
| 4,238,960 | 11/1978 | Curtis et al. | 73/462 |
| 4,419,894 | 12/1983 | Matumoto | 73/462 |

*Primary Examiner*—Stanley D. Miller
*Assistant Examiner*—Trong Quang Phan

[57] ABSTRACT

A magnetic transducer (10) mounted on a turbine engine forms a sinusoidal signal $N_1$ as the teeth of a gear (14) attached to the engine shaft pass the head of the magnetic transducer. One tooth of the gear is a "short tooth", having its tip slightly shaved, and acts as a reference point from which angular deviation is measured. The sinusoidal signal $N_1$ is first presented to a AGC (24) to maintain the peak-to-peak amplitude of the sinusoidal signal within a predetermined range. A pulse generator (32) forms a spike pulse each time the short tooth passes the magnetic transducer (10). A comparator circuit (40) uses the spike pulse to enable a one shot (44) creating a reference pulse of a specific length. A counter circuit (48), clocked by a zero axis detector (50), is provided for ensuring that only one reference pulse is generated for each rotation of the gear (14).

2 Claims, 6 Drawing Figures

DYNAMIC ANGULAR POSITION SENSOR FOR A REFERENCE GEAR TOOTH

TECHNICAL FIELD

This invention relates to a dynamic angular position sensor, and more particularly, to a circuit for use with a rotating gear for identifying the angular position of a reference tooth on the gear which may be part of a turbine engine, or the like, so that the engine can be trim balanced.

BACKGROUND ART

Modern-day turbine engines often use an electronic control system to monitor and control the numerous functions associated with engine operation. Some turbine engines have a gear fixedly mounted on the engine shaft and a magnetic transducer, or the like, may be positioned adjacent the gear to derive an electrical signal sinusoidally related to the passage of each gear tooth. Since the number of teeth on the gear is known, the periodicity of the sinusoidal signal can be directly related to the rotational velocity $N_1$ of the turbine engine, one of the many parameters important to engine operation.

Trim balance of the turbine engine is particularly significant for ensuring smooth, vibration-free operation of the turbine engine. In this type of dynamic balance, the angular position of a reference mark on the rotating shaft or other rotating portion of the engine must be related to a mechanical imbalance so that weight can be either added to, or removed from, the rotating member. A simple and inexpensive angular reference has been a "short tooth", i.e., a tooth on which a small amount of material has been removed, such as 0.020 inch from the tip of the gear tooth.

DISCLOSURE OF THE INVENTION

It is an object of the present invention to provide a dynamic angular position sensor for providing an electrical pulse which has a known relationship to a reference or short tooth on a rotating gear.

A particular feature of the dynamic angular position sensor for a gear tooth according to the present invention relates to a circuit which provides a reference pulse related to a short tooth on a rotating gear whose speed varies over a wide range.

According to the present invention, a dynamic angular position sensor includes a magnetic pickup which is positioned adjacent a rotating gear attached to the shaft of a turbine engine, or the like. A "short tooth" is used as a reference from which angular deviation for mechanical balancing purposes is measured. The sinusoidal signal from the magnetic transducer is presented to an automatic gain control circuit and an amplifier, biased close to saturation, for creating a constant amplitude sinusoidal signal, except for the deviation related to the short tooth. Each time the short tooth passes the magnetic transducer, a pulse generator presents a spike pulse to a discriminator. A comparator uses the spike pulse and a variable DC signal to generate an enable signal for a first one shot. The output of the first one shot which, through a counter circuit that is clocked by a zero axis detector, enables a second one shot to create a pulse of a predetermined length identifying the passage of the short tooth by the magnetic transducer.

The foregoing and other objects, features and advantages of the present invention will become more apparent from the following description of the preferred embodiment and accompanying drawing.

BEST MODE FOR CARRYING OUT THE INVENTION

Figure 1:
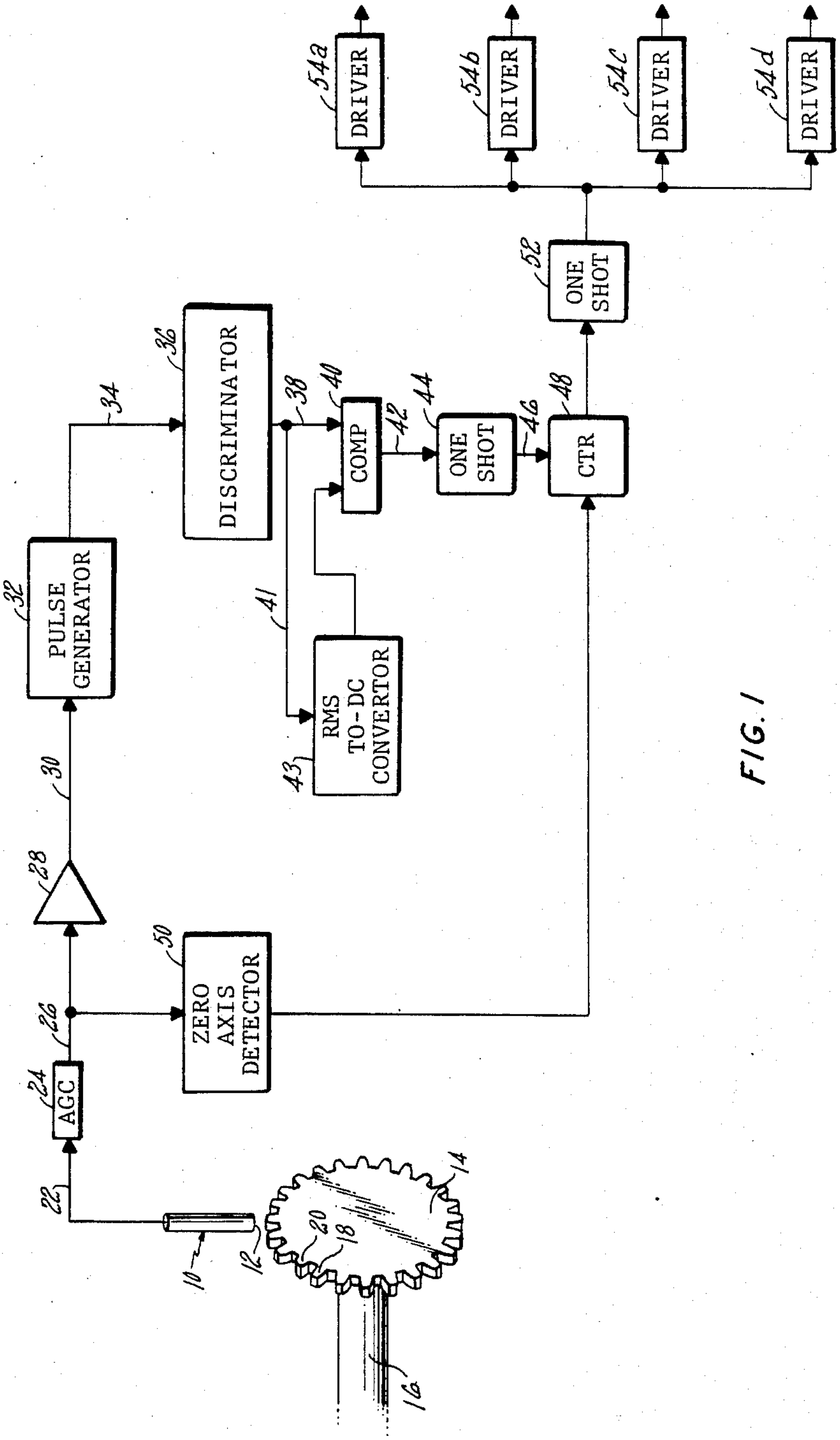
FIG. 1 is a block diagram depicting one embodiment of the dynamic angular position sensor according to the present invention; and FIG. *2a–2e* is a drawing depicting the signal waveforms at various points in the block diagram drawing of FIG. 1.

Referring first to FIG. 1, there is seen one embodiment of the dynamic angular position sensor for use with a reference gear tooth according to the present invention. This invention is particularly well suited for use with a turbine engine to provide a one pulse per engine revolution which acts as an electrical reference and would be presented to known vibration detectors for trim balancing the turbine engine.

The circuit of the present invention includes a magnetic transducer 10 which is fixedly mounted on the turbine engine such that the transducer head 12 is positioned adjacent to, and slightly spaced apart from, a gear 14 which rotates with a turbine engine shaft 16. The gear 14 has a plurality of teeth 18 positioned circumferentially about the gear 14. As is known, it is particularly important that the entire rotating mechanism of the turbine engine, i.e., the shafts, discs, blades, etc., be dynamically balanced to ensure vibration-free engine operation. In a procedure known as trim balance, a reference mark is placed on the end of the shaft 16 or the gear 14 and the turbine engine is operated through its rotational speed range so that test equipment (not shown) can be used to identify any dynamic imbalance with respect to the rotating reference point. Weight can then be added to, or removed from, the rotating portion of the turbine engine to correct the imbalanced condition.

A key aspect of the trim balance procedure involves the reference that is placed on the rotating gear or shaft. A simple and inexpensive procedure for providing an angular reference point is to file the tip of one tooth, such as tooth 20, such that it is, for example, 0.020 inch shorter in height than the remaining teeth 18 on the gear 14. The dynamic angular position sensor according to the present invention then detects this small height variation to provide one electrical reference pulse per revolution of the shaft 16 for use by the test equipement so that the turbine engine can be trim balanced.

Still referring to FIG. 1, the output of the magnetic transducer 10 is connected by a lead 22 to an AGC (automatic gain control) circuit 24. Since the peak-to-peak amplitude of the sinusoidal signal from the magnetic transducer 10 increases as the rotational speed of the gear 14 increases, the AGC 24 ensures that the peak-to-peak amplitude of the sinusoidal wave is within a predetermined range as is shown in FIG. *2a*.

Figure 2:
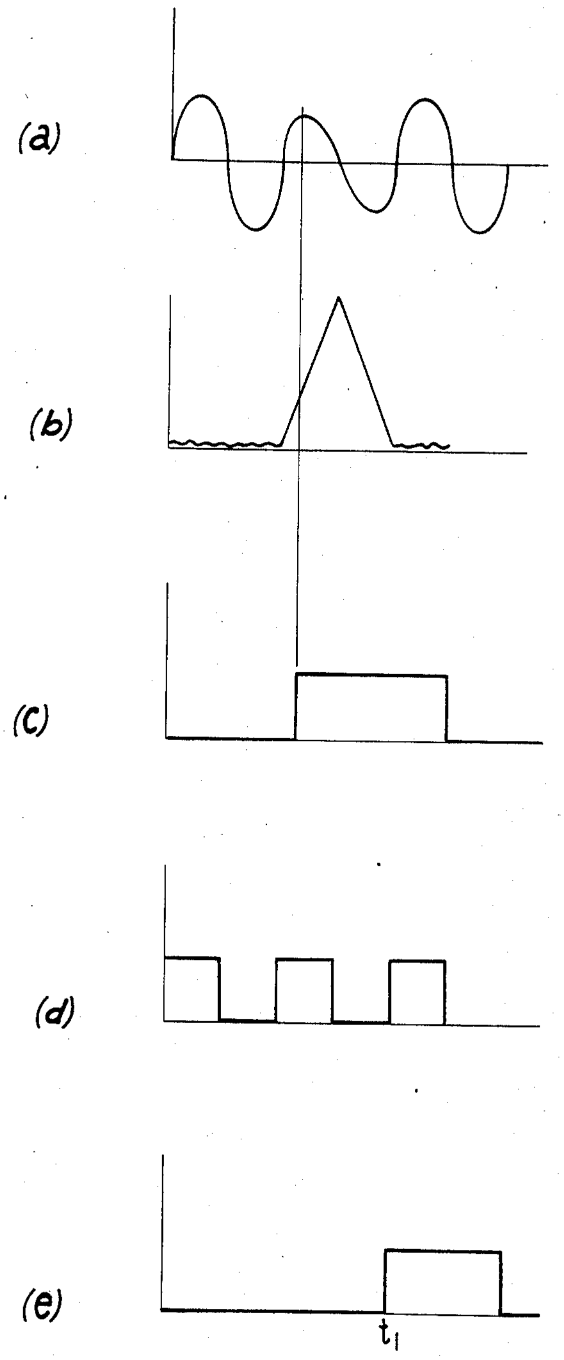

Next, the output from the AGC 24 is presented by a lead 26 to the input of an amplifier 28. The amplifier 28 is biased close to saturation so that it will clip any low frequency modulation caused by mechanical variances of the geaf 14, or the shaft 16. The output from amplifier 28 is then presented by a lead 30 to a pulse generator 32 which produces a DC output signal proportional to the RMS value of the signal at its input. The pulse generator 32 has a relatively fast time constant so that each time the short tooth 20 passes the head 12 of the magnetic transducer 10, the RMS value of the sinusoidal signal is less than the levels related to the remaining teeth 18 causing a spike pulse. Then, the spike pulse is fed by a lead 34 to a discriminator 36 which blocks its DC component, inverts and amplifies the spike pulse and attenuates the pulses produced by the remaining teeth 18 (FIG. 2*b*). The output from the discriminator 36; is presented by a lead 38 to one input of a comparator 40 and by a line 41 to a converter 43 which provides a DC reference voltage level proportional to the spike pulse amplitude for use by the comparator 40. A first one shot 44 is connected to, and enabled by, the output of the comparator 40 to provide a pulse of a predetermined length, such as 1.5 milliseconds, each time the short tooth 20 passes the head 12 of the magnetic transducer 10.

In order to improve pulse stability and ensure that only one reference pulse is provided for each revolution of the gear 14, the output from the first one shot 44 (FIG. 2*c*) is presented along a lead 46 to one input of a counter 48. The other input of the counter 48 is supplied by a zero axis detector 50 with the basic crossing points of the sinusoidal signal $N_1$ from the AGC 24. The counter 48 received an enable signal from the one shot 48 and a clock signal from the zero axis detector 50. The first positive transition after the short tooth occurs as the next tooth after the short tooth passes the head of the magnetic transducer 10 creating an output signal which enables a second one shot 52 (FIG. 2*e*). Because at higher rotational rates more than one pulse would be produced because of the time duration of the output pulse from the counter 48. The second one shot 52 is provided and has a time period which exceeds the time duration of the load pulse, e.g., three milliseconds, to ensure that the reference pulse is independent of engine rpm. A plurality of drivers 54*a*–*d* are provided through which the reference pulse (FIG. 2*e*) is presented to various equipment (not shown); the drivers 54 function to isolate the output signals from each other.

Although this invention has been shown and described with respect to a preferred embodiment, it will be understood by those skilled in this art that various changes in form and detail thereof may be made without departing from the spirit and scope of the claimed invention.

I claim:

1. A circuit for use with a gear having a plurality of constant height teeth therein, one tip of which has been shaved to act as a reference tooth, comprising:

transducer means including a head positioned adjacent said rotating gear for providing a sinusoidal signal related to the passage of each tooth by said head;

gain control means connected to said transducer means for providing an output signal comprising said sinusoidal signal with the peak-to-peak amplitude limited to a predetermined range;

pulse generator means for receiving said output signal and providing a spike output signal when the amplitude of said output signal exceeds a preset level;

comparator means connected to said pulse generator means for providing a reference pulse for each revolution of said gear, said reference pulse being indicative of the angular position of said reference tooth.

first one shot means for receiving the output of said comparator means to produce a reference pulse of a predetermined length;

a counter means that is enabled by said reference pulse from said first one shot means; and a zero axis detector means for detecting the transition points of said sinusoidal signal to provide a clocking output signal to clock the counter.

2. A circuit according to claim 1, further including a second one shot means connected to the output of said counter means for producing a final reference pulse on each revolution of said gear.

* * * * *